United States Patent
Sengupta et al.

(10) Patent No.: US 6,876,279 B2
(45) Date of Patent: Apr. 5, 2005

(54) VOLTAGE TUNABLE LAMINATED DIELECTRIC MATERIALS FOR A COPLANOR WAVEGUIDE

(75) Inventors: Louise Sengupta, Ellicott City, MD (US); Steven C. Stowell, Mt. Airy, MD (US); Yongfei Zhu, Columbia, MD (US); Somnath Sengupta, Ellicott City, MD (US); Luna H. Chiu, Abingdon, MD (US); Xubai Zhang, Columbia, MD (US)

(73) Assignee: Paratek Microwave, Inc., Columbia, MD (US)

( * ) Notice: Subject to any disclaimer, the term of this patent is extended or adjusted under 35 U.S.C. 154(b) by 0 days.

(21) Appl. No.: 10/068,512

(22) Filed: Feb. 6, 2002

(65) Prior Publication Data

US 2002/0093402 A1 Jul. 18, 2002

Related U.S. Application Data

(62) Division of application No. 09/419,047, filed on Oct. 15, 1999, now Pat. No. 6,377,142
(60) Provisional application No. 60/104,503, filed on Oct. 16, 1998.

(51) Int. Cl.$^7$ ................................................ H01P 3/08
(52) U.S. Cl. ........................................ 333/238; 333/246
(58) Field of Search ................................ 333/238, 995, 333/246

(56) References Cited

U.S. PATENT DOCUMENTS

| 5,694,134 A | * | 12/1997 | Barnes ..................... 333/161 X |
| 5,965,494 A | * | 10/1999 | Terashima et al. ......... 333/995 X |
| 6,049,726 A | * | 4/2000 | Gruenwald et al. ........ 333/995 X |

* cited by examiner

Primary Examiner—Benny Lee
(74) Attorney, Agent, or Firm—Robert P. Lenart; Michael N. Haynes; James S. Finn

(57) ABSTRACT

A tunable dielectric structure includes a first layer of dielectric material, a second layer of dielectric material positioned adjacent to the first layer of dielectric material, with the second layer of dielectric material having a dielectric constant that is less than the dielectric constant of the first layer of dielectric material, and electrodes for applying a controllable voltage across the first dielectric material, thereby controlling a dielectric constant of the first dielectric material, wherein at least one of the electrodes is positioned between the first and second layers of dielectric material. The dielectric materials can be formed in various shapes and assembled in various orientations with respect to each other. The tunable dielectric structure is used in various devices including coaxial cables, cavity antennas, microstrip lines, coplanar lines, and waveguides.

9 Claims, 5 Drawing Sheets

VOLTAGE TUNABLE LAMINATED DIELECTRIC MATERIALS FOR A COPLANOR WAVEGUIDE

CROSS REFERENCE TO RELATED PATENT APPLICATION

This application is a divisional application of U.S. patent application Ser. No. 09/419,047, filed Oct. 15, 1999 (now U.S. Pat. No. 6,377,142) which claims the benefit of U.S. Provisional Application 60/104,503, filed Oct. 16, 1998.

BACKGROUND OF INVENTION

The present invention relates generally to electronic materials for microwave applications, and more particularly to such materials including ferroelectric materials having a tunable dielectric constant.

Tunable ferroelectric materials are the materials whose permittivity (more commonly called dielectric constant) can be varied by varying the strength of an electric field to which the materials are subjected or immersed. Even though these materials work in their paraelectric phase above Curie temperature, they are conveniently called "ferroelectric" because they exhibit spontaneous polarization at temperatures below the Curie temperature. Typical tunable ferroelectric materials are barium-strontium titanate (BST) or BST composites. Examples of such materials can be found in U.S. Pat. Nos. 5,312,790, 5,427,988, 5,486,491 and 5,643,429. These materials, especially BSTO-MgO composites, show low dielectric loss and high tunability. Tunability is defined as the fractional change in the dielectric constant with applied voltage. These unique properties make these materials suitable for microwave applications such as phase shifter, tunable filters, tunable resonators, and delay lines.

U.S. Pat. No. 5,830,591 discloses a multi-layer ferroelectric composite waveguide in which the effective dielectric constant of the waveguide can be reduced while maintaining tunability. The waveguide is constructed of high and low dielectric constant layers. The multi-layer waveguide is comprised of bias plates that are perpendicular to the laminate direction to maintain tunability in the structure. The structure disclosed in U.S. Pat. No. 5,830,591 is only suitable for waveguide applications. Since high dielectric fields, for example about 10 V/$\mu$m, are necessary to tune tunable material, especially in waveguide applications, the distance between bias electrodes should be kept small. With the bias plate arrangement of U.S. Pat. No. 5,830,591, multiple layers would be needed along the direction of that bias plates as well as in the direction of the laminated dielectric material stack. This makes fabrication of such devices complex.

U.S. Pat. No. 5,729,239 discloses a device for scanning in a scanning plane that includes a periodic array of conductive plates disposed along the scanning axis, adjacent plates being disposed about half a wavelength apart. The device has a periodic array of slabs disposed along the scanning axis, each slab comprising ferroelectric material, being disposed between a pair of adjacent conductive plates of the periodic array of conductive plates, with adjacent slabs being separated by one of the conductive plates. Each of the slabs has a receiving face and a radiating face substantially parallel to each other. Each of the slabs transmits an electromagnetic signal from the receiving face to the radiating face. Input transmission means feed an input electromagnetic signal to the periodic array of slabs in a propagation direction so that the input electromagnetic signal is incident on the receiving faces of each of the slabs and so that the electrical component of the input electromagnetic signal received at each receiving face has a component parallel to the scanning axis. Output transmission means transmit an output signal from the periodic array of slabs responsive to the electromagnetic signal transmitted from each receiving face in the corresponding slab. The device also includes a plurality of means for selectively applying a voltage across each of the pairs of conductive plates disposed about a slab so as to selectively control the phase of the electromagnetic signal received at each of the radiating faces having been transmitted from the receiving face in the corresponding slab.

U.S. Pat. No. 5,729,239 discloses the use of barium strontium titanate (BSTO), or composites thereof, or other ceramics as the ferroelectric material. BSTO-MgO has also been proposed by others for use as a tunable ferroelectric material. However, the materials in the BSTO-MgO system generally have dielectric constants of over 100. The high dielectric constant is not suitable for some microwave applications such as patch antennas, which lower the antennas' efficiencies. High dielectric constant materials also cause low characteristic impedance (<10 $\Omega$) in microstrip, coplanar, and other planar structure transmission lines, which strongly limits the application of high dielectric constant materials. Low dielectric constant materials (for example, with dielectric constants less than 40) with low loss and high tunability are desired for patch antennas and other microwave applications.

It would be desirable to construct a ferroelectric structure having a relatively low overall dielectric constant that takes advantage of the high tunability and low loss characteristics of materials such as BST composites, having high dielectric constants. It is further desired to construct such structures for use in various microwave devices such as microstrips, coplanar or other planar microwave transmission lines, coaxial cable, or waveguides.

SUMMARY OF THE INVENTION

This invention provides a tunable dielectric structure including a first layer off dielectric material, and a second layer of dielectric material positioned adjacent to the first layer of dielectric material, with the second layer of dielectric material having a dielectric constant that is less than the dielectric constant of the first layer of dielectric material. The structure further includes electrodes for applying a controllable voltage across the first dielectric material, thereby controlling a dielectric constant of the first dielectric material, wherein at least one of the electrodes is positioned between the first and second layers of dielectric material.

The dielectric materials can be formed in various shapes and assembled in various orientations with respect to each other. The laminated structures of such dielectric materials herein serve as substrates for coplanar lines.

BRIEF DESCRIPTION OF THE DRAWINGS

A full understanding of the invention can be gained from the following description of the preferred embodiments when read in conjunction with the accompanying drawings in which.

DETAILED DESCRIPTION OF THE INVENTION

Figure 1:
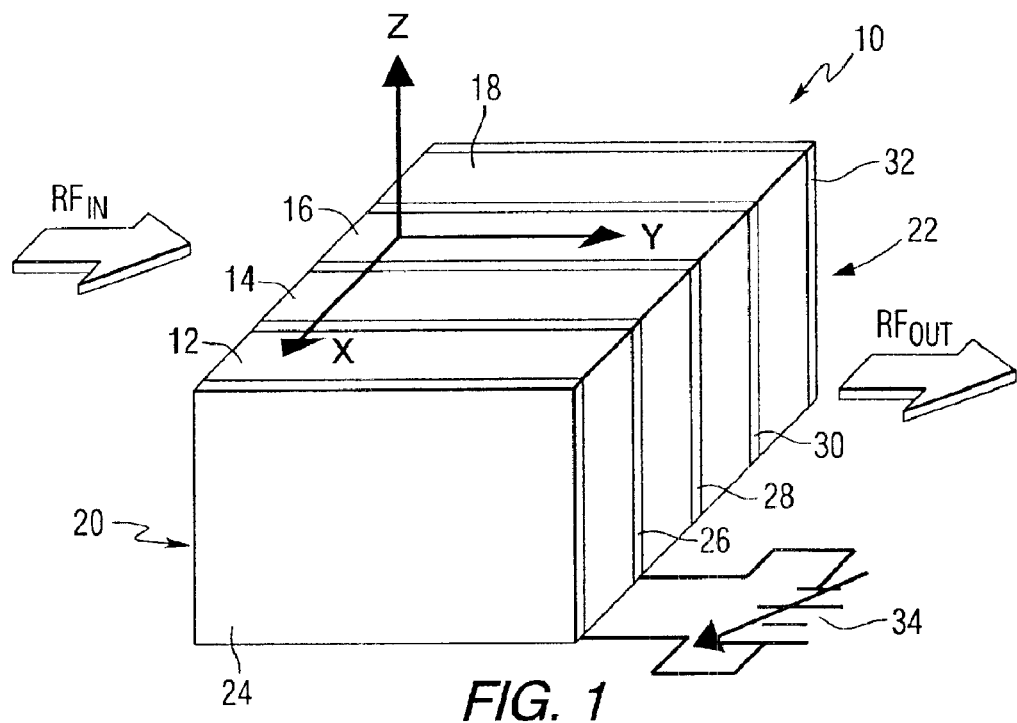
FIG. 1 is isometric view of a dielectric structure of the laminated material constructed in accordance with a preferred embodiment of the invention.

Referring to the drawings, FIG. 1 is an isometric view of an electronic device having a dielectric structure of laminated materials constructed in accordance with a preferred embodiment of the invention. The tunable dielectric device 10 comprises a multilayered structure of dielectric materials 12, 14, 16, 18 including two or more materials having different dielectric constants, and being laminated together to tailor the overall dielectric constant and tunability. One or more materials (e.g. 12 and 16) in the laminated structure are tunable dielectric materials usually with a high dielectric constant, low losses, and high tunability. For the purposes of this description, a high dielectric constant is greater than about 100, low loss materials have loss tangents (tan δ) of less than about 0.01, and tunability of greater than about 15% at 2 V/μm. The high dielectric constant, low loss and high tunability materials may be $Ba_{1-x}Sr_xTiO_3$ (BSTO), where x can vary between zero and one, and composites thereof that exhibit such low losses and high tunability. Examples of such composites include, but are not limited to: BSTO-MgO, BSTO-MgAl$_2$O$_4$, BSTO-CaTiO$_3$, BSTO-MgTiO$_3$, BSTO-MgSrZrTiO$_6$, or any combination thereof. The other materials (e.g. 14 and 18) in the laminated structure may be tunable or non-tunable dielectric materials such as $Ba_{1-x}Sr_xTiO_3$-based materials, alumina, Mica, and air. Since air is the lowest dielectric material and the lowest loss material, it is particularly useful for certain applications. If air is used as the non-tunable dielectric in the structures of this invention, the tunable materials would be mounted with air gaps between tunable layers. The resultant overall dielectric constant, tunability and other properties of the laminated material is dependent on the relative properties and thickness of each of the layered materials. Therefore, these properties can be tailored by varying the number of layers of dielectric materials with certain dielectric constant characteristics, and varying the thickness of the layers.

The laminate material of the present invention appears as a uniform material to a radio frequency signal that is applied to the structure. While the structures of the invention are not limited to any particular dimensions, the thickness of the layers should be such that this apparent uniformity is achieved. In the preferred embodiments, that thickness of the dielectric layers is smaller than one-tenth of the wavelength of the radio frequency signal to be used with the device.

In the embodiment of FIG. 1, each of the dielectric materials is in the form of a rectangular slab. Each slab has an input end 20 for receiving a radio frequency signal ($RF_{IN}$) and an output end 22 for delivering the signal ($RF_{OUT}$). In general, the laminated structure of FIG. 1 can serve as a tunable dielectric media for microwave transmission. The means for inputting and outputting a radio frequency signal from the structure will depend upon the application in which it is used. Electrodes 24, 26, 28, 30 and 32, in the form of sheets of conductive material are located at each end of the stack and between each of the tunable dielectric materials. The electrodes are positioned adjacent to opposite faces of at least each slab that is comprised of tunable ferroelectric material. With this structure, at least some of the electrodes are positioned within the laminate stack and lie in planes parallel to the direction of propagation of the RF signal and parallel to opposite faces of the slabs of tunable material. For those dielectric material slabs that have a voltage controlled dielectric constant, a controllable DC voltage source 34 is electrically connected to the electrodes on opposite sides of the slab. In FIG. 1, only one controllable DC voltage source is shown, but it must be understood that additional voltage sources may be used to control the dielectric constant of the several slabs, or the same DC voltage source may be connected to multiple slabs of dielectric material. In the preferred embodiments, layers of the same tunable dielectric material would be subject to the same bias voltage. In addition, the polarity of the applied voltage can be changed without affecting performance of the device. A coordinate system is illustrated in FIG. 1 such that the slabs lie in planes parallel to the y-z plane, and are stacked in the x direction. The radio frequency signal propagates in the y direction through the device.

Figure 2:
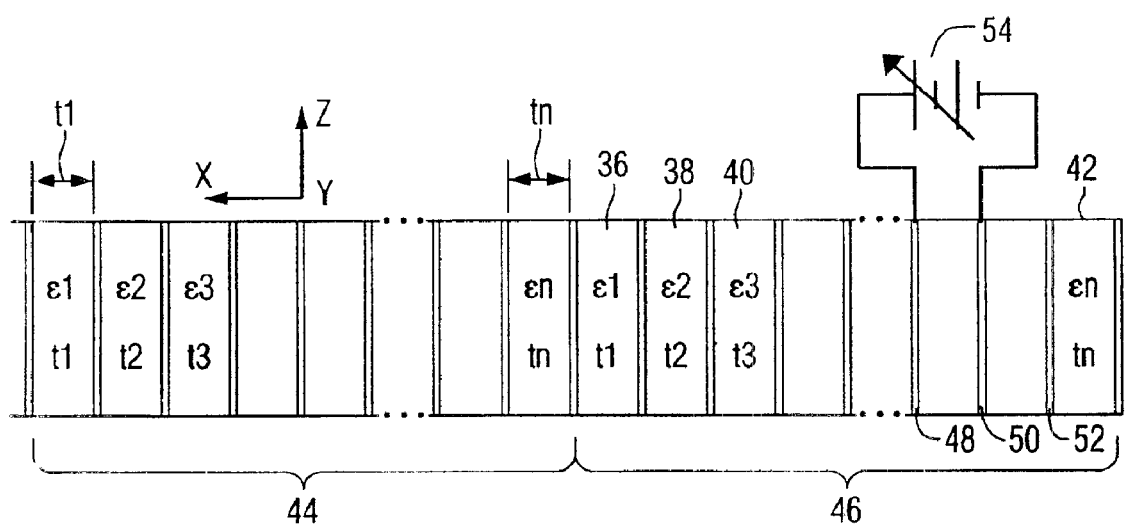
FIG. 2 is schematic representation of a laminated structure in accordance with the invention.

FIG. 2 is a schematic representation of a laminated structure in accordance with the invention. In the embodiment depicted in FIG. 2, a plurality of slabs 36, 38, 40 and 42 of dielectric material are shown to have dielectric constants of $\in1, \in2, \in3$, through $\in n$, and thickness t1, t2, t3, through tn, respectively. FIG. 2 shows a structure that includes two assemblies 44 and 46, each having the same arrangement of dielectric materials. A plurality of electrodes, for example 48, 50 and 52 are positioned between the dielectric slabs and are connected to one or more controllable DC voltage sources. In FIG. 2, one controllable voltage source 54 is shown for clarity. However, as discussed above multiple sources, and/or multiple connections to a single source may be used in operational devices. This figure illustrates that a complete device can be comprised of multiple subassemblies, each having the same or a similar arrangement of dielectric materials. Coordinates x, y and z in FIG. 2 correspond to coordinates x, y and z in FIG. 1.

Figure 3:
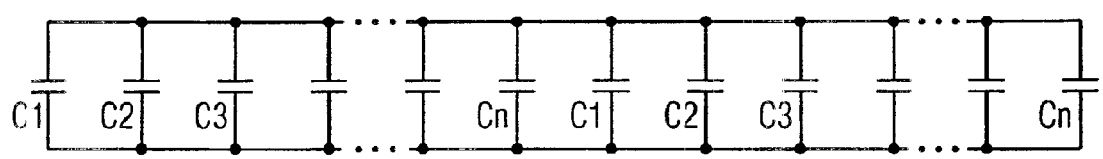
FIG. 3 is a schematic of the equivalent electric circuit of a laminated structure in accordance with the invention.

FIG. 3 is a schematic of the equivalent electric circuit of a laminated structure in accordance with the invention. In FIG. 3, at least selected ones of the various values of capacitance $C_1, C_2, C_3$, through $C_n$, can be changed by varying the control voltages applied to the dielectric slabs that contain tunable ferroelectric material. The overall capacitance of the laminated structure is the sum of the capacitance of the individual slabs.

Figure 4:
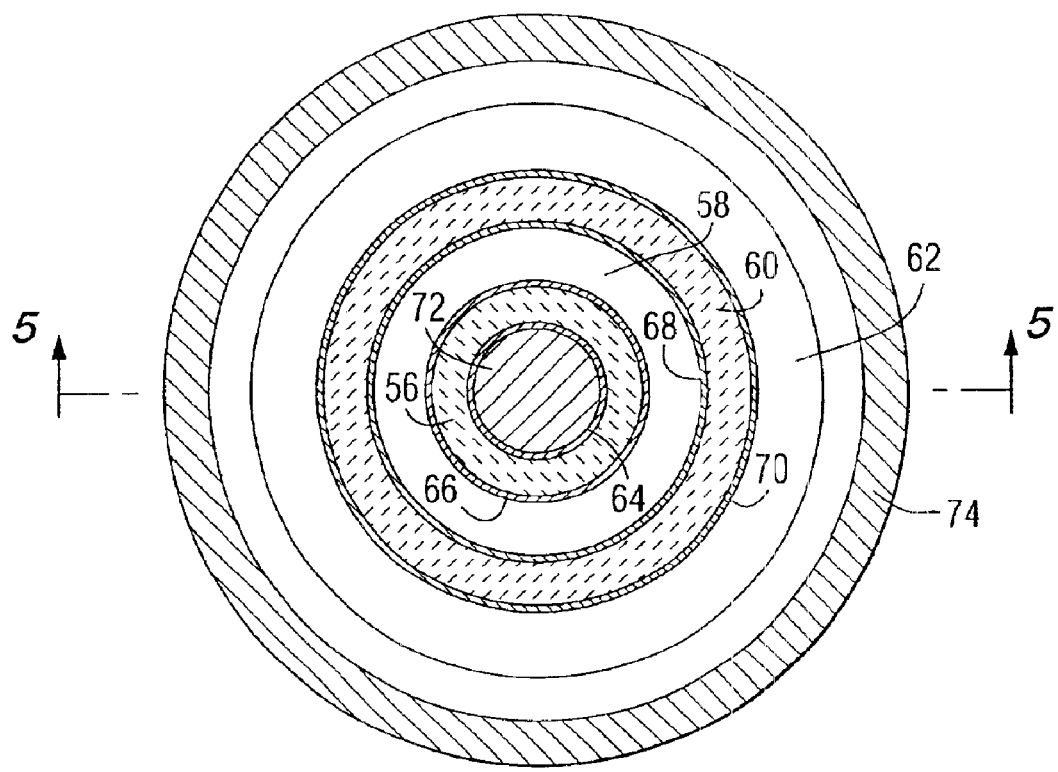
FIG. 4 is an end view of a coaxial line that includes a dielectric structure of the laminated material constructed in accordance with the invention.

FIG. 4 is an end view of an alternative embodiment of the invention for tunable coaxial cable applications in which the dielectric material is arranged in concentric cylinders 56, 58, 60, and 62. Here again, some of the layers of dielectric material can be tunable material having relatively high dielectric constants, low losses and high tunability, while the other layers can be tunable or non-tunable material. Concentric cylindrical electrodes 64, 66, 68 and 70 are positioned between the dielectric materials so that a bias voltage can be applied to the control the dielectric constants of the dielectric cylinders that contain tunable ferroelectric material. A metallic center conductor 72, and a cylindrical metallic ground 74 are provided to carry the RF signal through the cable.

Figure 5:
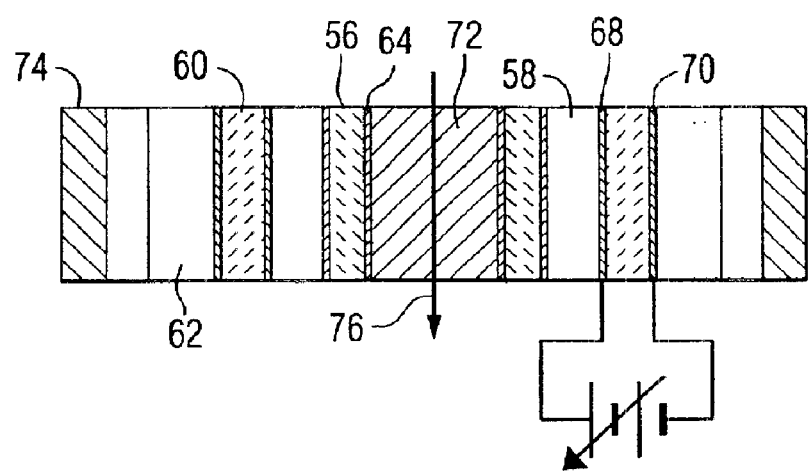
FIG. 5 is a cross sectional view of the structure of FIG. 4, taken along line 5—5.

FIG. 5 is a cross sectional view of the structure of FIG. 4, taken along line 5—5. One of the controllable DC voltage sources is shown to be connected to electrodes 68 and 70. Additional controllable voltage sources (not shown) would be used for applying bias voltages to other electrodes that lie adjacent to the internal and external surfaces of the tunable layers. The direction of propagation of a radio frequency signal through the structure is illustrated by arrow 76. The cylindrical electrodes are positioned around an axis that lies parallel to the direction of propagation of the radio frequency signal through the device. In FIG. 5, items 56, 58, 60, 62, 64, 72 and 74 identify that same structures as identified by those item numbers in FIG. 4.

Figure 6:
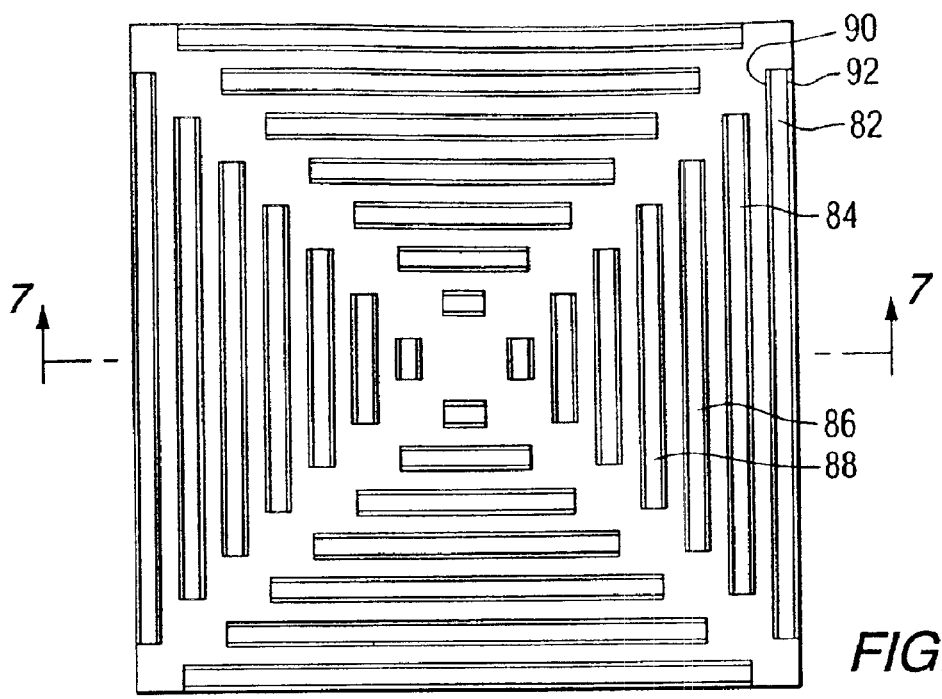
FIG. 6 is an end view of another alternative embodiment of the invention for antenna applications.

FIG. 6 is an end view of another embodiment of the invention in the form of a tunable cavity antenna that includes a plurality of rectangular slabs of dielectric material, a representative sample of which are numbered as items 82, 84, 86 and 88. Each of the slabs has a pair of electrodes, as illustrated by items 90 and 92, on opposite sides thereof for the application of a bias voltage. As shown in the figure, the slabs are arranged such that certain slabs lie in planes that are perpendicular to the planes occupied by certain other slabs. This invention provides a tunable cavity for a cavity antenna by placing a laminated, tunable material, with a specific dielectric constant, into the cavity. The open spaces in the cavity of FIG. 6 can be filled with air or a non-tunable dielectric material.

Figure 7:
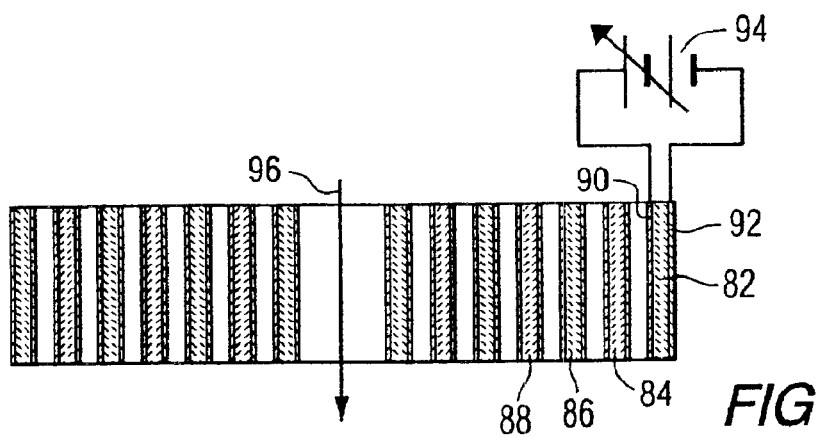
FIG. 7 is a cross sectional view of the structure of FIG. 6, taken along line 7—7.

FIG. 7 is a cross sectional view of the structure of FIG. 6, taken along line 7—7. In FIG. 7, items 82, 84, 86, 88, 90 and 92 identify the same structures as identified by those item numbers in FIG. 6. A controllable voltage source 94 is shown to supply a controllable bias voltage to electrodes 90 and 92, thereby controlling the dielectric constant of the dielectric material 82. While only one controllable voltage source is shown, it will be appreciated by those skilled in the art that additional controllable voltage sources, or alternative connects to a single source, would be used to practice the invention. Arrow 96 illustrates the direction of propagation of a radio frequency signal through the device. In the structure of FIGS. 6 and 7, selected ones of the dielectric slabs can contain material having a relatively high dielectric constant, low losses, and high tunability. The other slabs of dielectric material can be tunable or non-tunable materials.

Figure 8:
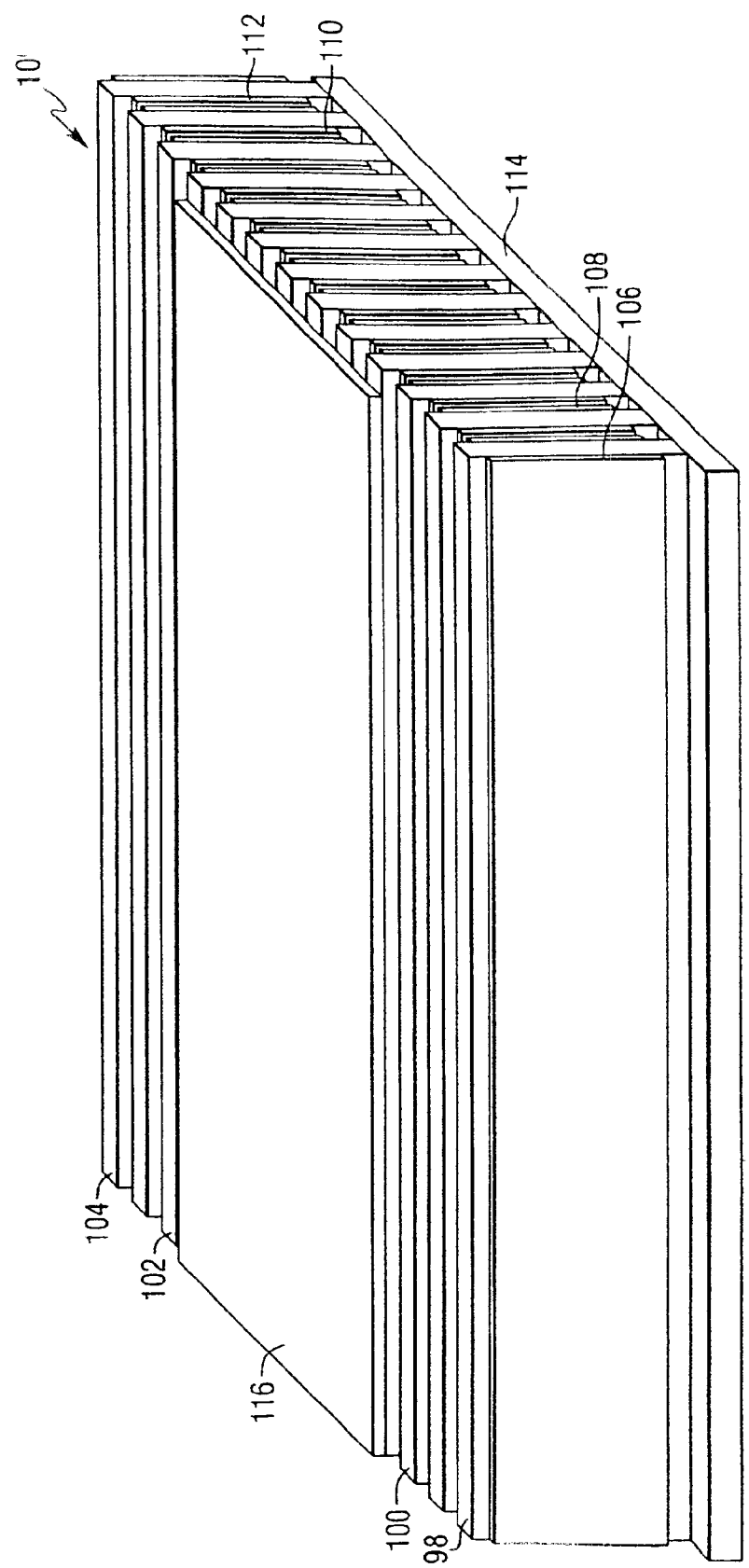
FIG. 8 is isometric view of a microstrip line that includes a dielectric structure of the laminated material constructed in accordance with the invention.

FIG. 8 is an isometric view of a microstrip line that includes a dielectric structure of the laminated material constructed in accordance with the invention. In this embodiment, a laminated structure 10' similar to that of FIG. 1 is constructed of a plurality of slabs of dielectric material, as illustrated by items 98, 100, 102 and 104. Here again, electrodes are positioned on opposite sides of the slabs, as illustrated by electrodes 106, 108, 110, and 112. The laminated structure 10' is mounted on a ground plane 114 such that the slabs are positioned generally perpendicular to the ground plane. A microstrip 116 is mounted on a side of the laminated structure opposite the ground plane.

Figure 9:
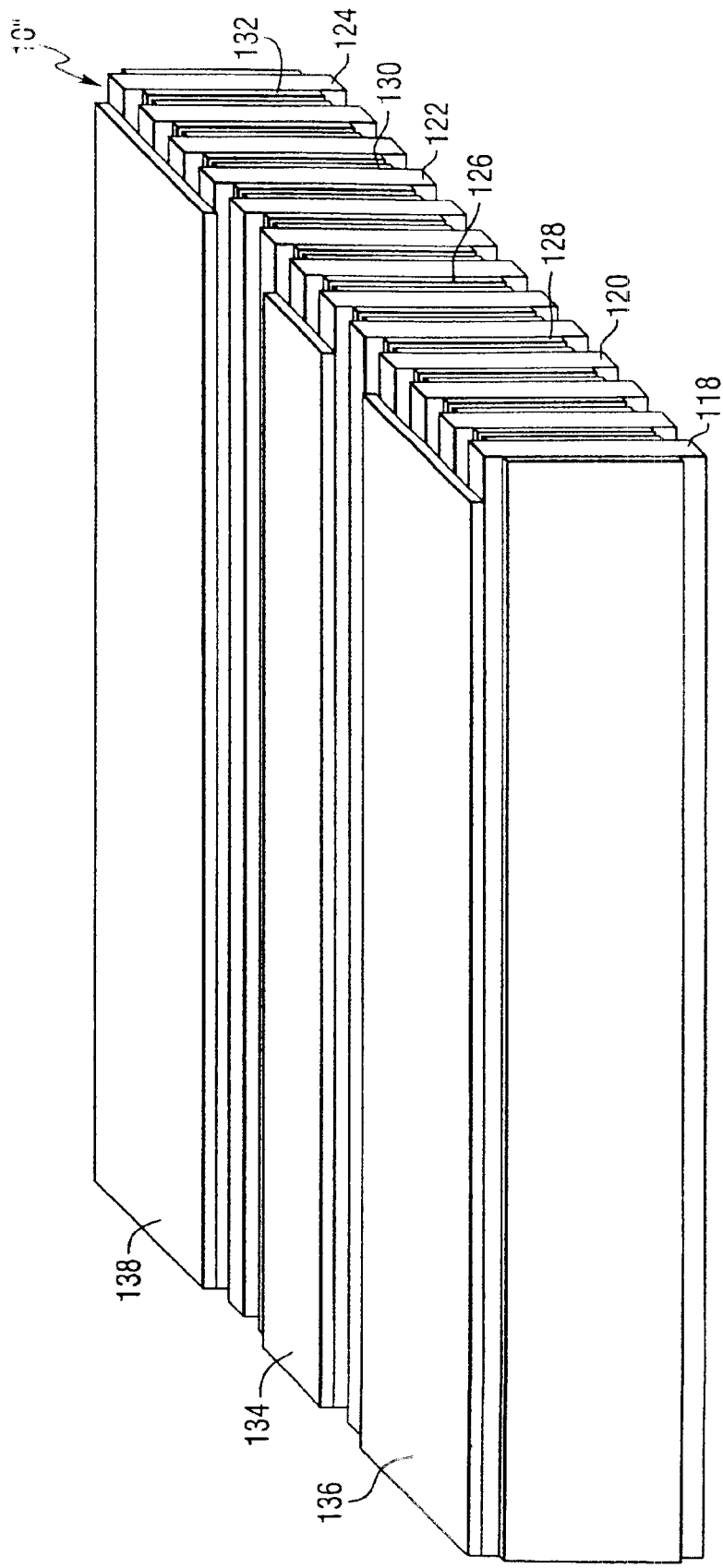
FIG. 9 is isometric view of a coplanar line that includes a dielectric structure of the laminated material constructed in accordance with the invention.

FIG. 9 is an isometric view of a coplanar line that includes a dielectric structure of the laminated material constructed in accordance with the invention. In this embodiment, a laminated structure 10" similar to that of FIG. 1 is constructed of a plurality of slabs of dielectric material, as illustrated by items 118, 120, 122, and 124. Here again, electrodes are positioned on opposite sides of the slabs, as illustrated by electrodes 126, 128, 130, and 132. A center strip 134 and two ground planes 136 and 138 are mounted on one side of the laminated structure. The ground planes are positioned on opposite sides of the center strip. The RF signal is transmitted through the center strip and the adjacent ground planes.

As illustrated and oriented in FIG. 9, laminated structure 10" can comprise a horizontally stacked multi-layered stack of substantially rectangular and substantially planar slabs 118, 120, 122, 124 constructed of dielectric material, each slab segregated from its nearest neighboring slab by one of a plurality of adjacent substantially rectangular and substantially planar electrodes 126, 128, 130, 132. Each of slabs 118, 120, 122, 124 defines a respective length, width, and thickness, the length substantially greater that the width, the width substantially greater than the thickness. Each of electrodes 126, 128, 130, 132 defines a respective length, width, and thickness, the length substantially greater that the width, the width substantially greater than the thickness. Each of substantially rectangular and substantially planar ground planes 136, 138 defines a respective length, width, and thickness, the length substantially greater that the width, the width substantially greater than the thickness. Substantially rectangular and substantially planar center strip 134 defines a length, width, and thickness, the length substantially greater that the width, the width substantially greater than the thickness. As illustrated, each of slabs 118, 120, 122, 124, electrodes 126, 128, 130, 132, ground planes 136, 138, and center strip 134 substantially resembles a cuboid (a.k.a., a rectangular parallelepiped).

As illustrated and oriented in FIG. 9, each of slabs 118, 120, 122, 124 respectively comprises two opposing sides, each side defined by the respective length and the width. Each of electrodes 126, 128, 130, 132 respectively comprises two opposing sides, each side defined by the respective length and the width. Each of ground planes 136, 138 respectively comprises two opposing sides, each side defined by the respective length and the width. Center strip 134 comprises two opposing sides, each side defined by the respective length and the width.

As illustrated and oriented in FIG. 9, each of slabs 118, 120, 122, 124 respectively comprises two horizontal edges and two vertical edges, the horizontal edges defined by the length and thickness of the respective slab, the vertical edges defined by the width and thickness of the respective slab. Each of electrodes 126, 128, 130, 132 respectively comprises two horizontal edges and two vertical edges, the horizontal edges defined by the length and thickness of the respective electrode, the vertical edges defined by the width and thickness of the respective electrode. Each of ground planes 136, 138 respectively comprises two edges defined by the length and thickness of the respective ground plane, and two edges defined by the width and thickness of the respective ground plane. Center strip 134 comprises two edges defined by the length and thickness of center strip 134, and two edges defined by the width and thickness of center strip 134.

As illustrated and oriented in FIG. 9, each of ground planes 136, 138 can be mounted with its sides perpendicular to the sides of slabs 118, 120, 122, 124. Each of ground planes 136, 138 can be mounted with its sides perpendicular to the sides of electrodes 126, 128, 130, 132. Center strip 134 can be mounted with its sides perpendicular to the sides of slabs 118, 120, 122, 124. Center strip 134 can be mounted with its sides perpendicular to the sides of electrodes 126,

128, 130, 132. Ground planes 136, 138 can be positioned lengthwise parallel to, coplanar with, and spatially separated from, center strip 134. Center strip 134 can be located between ground planes 136, 138.

Figure 10:
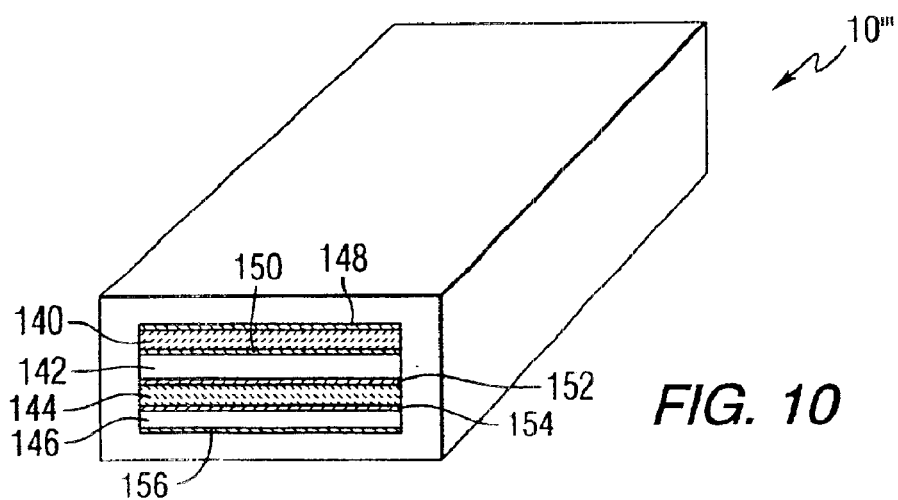
FIG. 10 is an isometric view of a waveguide that includes a dielectric structure of laminated material constructed in accordance with the invention.

FIG. 10 is an isometric view of a waveguide that includes a dielectric structure of laminated materials constructed in accordance with the invention. In this embodiment, a laminated structure 10''' similar to that of FIG. 1 is constructed of a plurality of slabs of dielectric material, as illustrated by 140, 142, 144, and 146. Here again, the electrodes are positioned on opposite sides of the tunable slabs, as illustrated by electrodes 148, 150, 152 and 154. The laminated material is filled into the waveguide 156 in a manner similar to that used for known dielectric loaded waveguides. The RF signal is then input and output in accordance with known techniques.

The laminated dielectric material structure of the present invention can provide certain overall dielectric constant(s) and tunability by laminating high dielectric constant, high tunability material(s) with low dielectric constant tunable or non-tunable material(s) without substantial lowering of their tunability, or degradation of dielectric loss. For the purposes of this invention, high dielectric materials have a dielectric constant greater than about 100, and low dielectric materials have a dielectric constant lower than about 30.

FIG. 1 illustrates the concept of the present invention, which consists of n (n≧2) layers of different materials with dielectric constants $\epsilon_n$, and thickness $t_n$. Since the equivalent circuit is that of parallel capacitors, the resultant dielectric constant $\epsilon_e$ of the laminated material is expressed as following:

$$\varepsilon_e^0 = \sum_{i=1}^{n} \frac{t_i}{T} \varepsilon_i^0; \left(T = \sum_{i=1}^{n} t_i\right) \quad (1)$$

here $\epsilon_e^0$ is the resultant dielectric constant of the laminated materials at no dc bias, $t_i$ is the thickness of the ith layer, T is the total thickness of the laminated materials, $\epsilon_i^0$ is the dielectric constant of the ith layer at no dc bias.

Under dc bias conditions:

$$\varepsilon_e^v = \sum_{i=1}^{n} \frac{t_i}{T} \varepsilon_i^v; \quad (2)$$

where $\epsilon_e^v$ is the resultant dielectric constant of the laminated materials at a dc bias of field E, and $\epsilon_i^v$ is the dielectric constant of the ith layer at dc bias of field E. Then:

$$\varepsilon_i^v = \varepsilon_i^0 (1 - b_i E); \quad (3)$$

where $b_i$ is the tunability of ith material, which is defined as:

$$b_i = \frac{\frac{d\varepsilon_i^v}{dE}}{\varepsilon_i^0}; \quad (4)$$

Therefore, the tunability of the laminated material is:

$$b_e = -\frac{\frac{d\varepsilon_e^v}{dE}}{\varepsilon_e^0} \quad (5)$$

$$= \frac{\sum_{i=1}^{n} \frac{t_i}{T} \varepsilon_i^0 b_i}{\sum_{i=1}^{n} \frac{t_i}{T} \varepsilon_i^0}$$

In the case of all layers having the same tunability but with different dielectric constants, equation (5) will be $$b_e = b_1; I = 1, 2, \ldots, n \quad (6)$$

Equation (6) indicates that the laminated material has the same tunability as the individual tunability of each layer.

Now a two-layer case is considered. Layer 1 is a tunable material with high dielectric constant. Layer 2 is a non-tunable material with low dielectric constant. If $t_1 \cong t_2$ or $t_1$ is not much smaller than $t_2$, we can get from equation (5) that $$b_e = b_1; \quad (7)$$

Equation (7) indicates the laminated material tunability is the same as the tunable layer.

This invention provides a multi-layered structure of high dielectric constant, low loss, and high tunability materials laminated with low dielectric materials, which may be tunable or non-tunable. The invention is not limited only to obtaining low dielectric constant materials. Any dielectric constant bounded by the dielectric constants associated with the individual layers can be achieved with this method.

The method of laminating different layers can be simply mechanical, co-firing, or thick film and/or thin film processing. In these methods, the properties of the individual layers should be the same as, or close to the properties of the corresponding layers in the final laminated structure.

Accordingly, in the present invention, a laminated structure material can be realized by alternating two or more different dielectric constant materials using either physical or chemical processing. The dielectric constant can be tailored by choosing both proper materials and layer thickness with little or no loss of tunability or degradation of dielectric loss.

An advantage of the present invention is that a certain overall dielectric constants can be easily tailored by laminating high dielectric constant material(s) with low dielectric constant material(s). The resultant dielectric constant of the laminated material(s) can range from several to tens, even to hundreds if necessary, since the high dielectric material(s) may be $Ba_{1-x}Sr_xTiO_3$ (BSTO), where x can vary between zero and one, and BSTO composites, with dielectric constants that vary from about 100 to thousands, and low dielectric constant material(s) such as air ($\epsilon=1$), and/or other dielectric materials such as alumina ($\epsilon=9-10$), Mica ($\epsilon=4.2$), and $Ba_{1-x}Sr_xTiO_3$-based materials.

While the present invention has been disclosed in terms of its presently preferred embodiments, it will be understood by those in the art that various modifications of the disclosed embodiments can be made without departing from the spirit and scope of this invention, which is defined by the following claims.

What is claimed is:

1. A coplanar line comprising:
   a first rectangular slab of a horizontally stacked multi-layered stack of rectangular slabs of dielectric material, said first rectangular slab comprising a first side, a second side and two edges, said first rectangular slab having a first dielectric constant;

a second rectangular slab of said horizontally stacked multi-layered stack of rectangular slabs of dielectric material;

said second rectangular slab having a second dielectric constant less than 30, the second dielectric constant less than the first dielectric constant;

a first electrode adjacent to said first side of said first rectangular slab of dielectric material and a second electrode adjacent to said second side of said first rectangular slab of dielectric material, said first electrode and said second electrode for applying a controllable voltage across said first rectangular slab of dielectric material thereby controlling the first dielectric constant of said first rectangular slab of dielectric material said second rectangular slab comprising a first side, a second side and two edges;

a center strip positioned with a side of said center strip perpendicular to said first side of each of said first and second rectangular slabs of dielectric material; and a first ground plane positioned with a side of said first ground plane perpendicular to said first side of each of said first and second rectangular slabs of dielectric material; and a second ground plane positioned with a side of said second ground plane perpendicular to said first side of each of the first and second rectangular slabs of dielectric material, wherein said center strip is positioned between said first ground plane and said second ground plane.

2. A coplanar line as recited in claim 1, further comprising:

means for applying a controllable voltage across said second rectangular slab of dielectric material, thereby controlling the dielectric constant of said second rectangular slab of dielectric material.

3. A coplanar line as recited in claim 1, further comprising:

a plurality of additional rectangular slabs of dielectric material horizontally stacked with said first and second rectangular slabs, said additional rectangular slabs of dielectric material include at least one layer having a tunable dielectric constant.

4. A coplanar line as recited in claim 3, wherein said first, second and additional layers of dielectric material are assembled into a plurality of subassemblies, said subassemblies having the same arrangement of dielectric materials.

5. A coplanar line as recited in claim 1, wherein said first rectangular slab of dielectric material has dielectric constant greater than about 100 and a loss tangent of less than about 0.01.

6. A coplanar line as recited in claim 1, wherein said second rectangular slab of dielectric material is selected from the group consisting of $Ba_{1-x}Sr_xTiO_3$ composite where x ranges from zero to one, alumina, mica, and air.

7. A coplanar line as recited in claim 1, wherein said first and second rectangular slabs of dielectric material are selected from the group consisting of bulk, tape, thick film and thin film layers.

8. A coplanar line as recited in claim 1, wherein said first and second rectangular slabs of dielectric material each have a thickness less than about one tenth of the wavelength of a radio frequency signal to be transmitted through the coplanar line.

9. A coplanar line as recited in claim 1, wherein said first rectangular slab of dielectric material is selected from the group consisting of BSTO, BSTO-MgO, BSTO-MgAl$_2$O$_4$, BSTO-CaTiO$_3$, BSTO-MgTiO$_3$ and BSTO-MgSrZrTiO$_6$.

* * * * *